(12) United States Patent
Lunzer et al.

(10) Patent No.: US 7,944,234 B2
(45) Date of Patent: May 17, 2011

(54) PROGRAMMABLE ON-CHIP LOGIC ANALYZER APPARATUS, SYSTEMS, AND METHODS

(75) Inventors: Kirsten S. Lunzer, Arden Hills, MN (US); Jeffrey J. Rooney, Blaine, MN (US)

(73) Assignee: Micron Technology, Inc., Boise, ID (US)

( * ) Notice: Subject to any disclaimer, the term of this patent is extended or adjusted under 35 U.S.C. 154(b) by 376 days.

(21) Appl. No.: 12/051,723

(22) Filed: Mar. 19, 2008

(65) Prior Publication Data
US 2009/0237110 A1     Sep. 24, 2009

(51) Int. Cl.
*H03K 19/173* (2006.01)
(52) U.S. Cl. ............... 326/38; 326/41; 326/47; 714/30; 714/31; 714/39
(58) Field of Classification Search ............... 326/37–41, 326/47; 703/23, 25, 28, 10, 24, 19, 13; 714/30, 714/31, 25, 27, 28, 33, 34, 733; 713/400, 713/500, 501, 502, 503, 600
See application file for complete search history.

(56) References Cited

U.S. PATENT DOCUMENTS

| | | | | |
|---|---|---|---|---|
| 6,725,391 | B2 * | 4/2004 | Swoboda | 713/500 |
| 7,325,164 | B2 * | 1/2008 | Swanson et al. | 714/30 |
| 7,332,929 | B1 * | 2/2008 | Normoyle et al. | 326/16 |
| 7,739,097 | B2 * | 6/2010 | Sample et al. | 703/19 |

* cited by examiner

*Primary Examiner* — James H. Cho
*Assistant Examiner* — Christopher Lo
(74) *Attorney, Agent, or Firm* — Schwegman, Lundberg & Woessner, P.A.

(57) ABSTRACT

Apparatus, systems, and methods disclosed herein may cause an event trigger state machine associated with a programmable on-chip logic analyzer (POCLA) to transition to a programmable state at a programmable number of occurrences of a programmable set of events associated with a first subset of signals on a first subset of input signal paths. States associated with a second subset of signals on a second subset of input signal paths may be stored at a time relative to a transition to the programmable state if a set of storage criteria have been met. Additional embodiments are disclosed and claimed.

25 Claims, 10 Drawing Sheets

FIG. 1

LEGEND:

— · —▶  NEXT STATE IF EVENT #1 OCCURS

— · · ▶  NEXT STATE IF EVENT #2 OCCURS

········▶  MAINTAIN CURRENT STATE IF
         EVENT #3 OCCURS

○  A PRE-TRIGGER STATE

◍  A TRIGGER STATE

◐  A POST-TRIGGER STATE

◑  AN UNUSED STATE

PROGRAMMABLE ON-CHIP LOGIC ANALYZER APPARATUS, SYSTEMS, AND METHODS

TECHNICAL FIELD

Various embodiments described herein relate to apparatus, systems, and methods associated with automatic test equipment, including logic analyzers.

BACKGROUND INFORMATION

In the field of automatic test equipment (ATE), logic analyzers may be used to store a series of states associated with signals on one or more digital signal lines or logic chip pins over a period of time. At each state capture time, a bit from each signal line or chip pin under test may be stored as a corresponding bit in a data capture word. The latter word is sometimes referred to as a capture "vector." Each stored capture vector may be compared subsequently to an expected vector value. Expected vector values may be pre-determined based upon the design and tolerances of the circuit under test.

DETAILED DESCRIPTION

Figure 1:
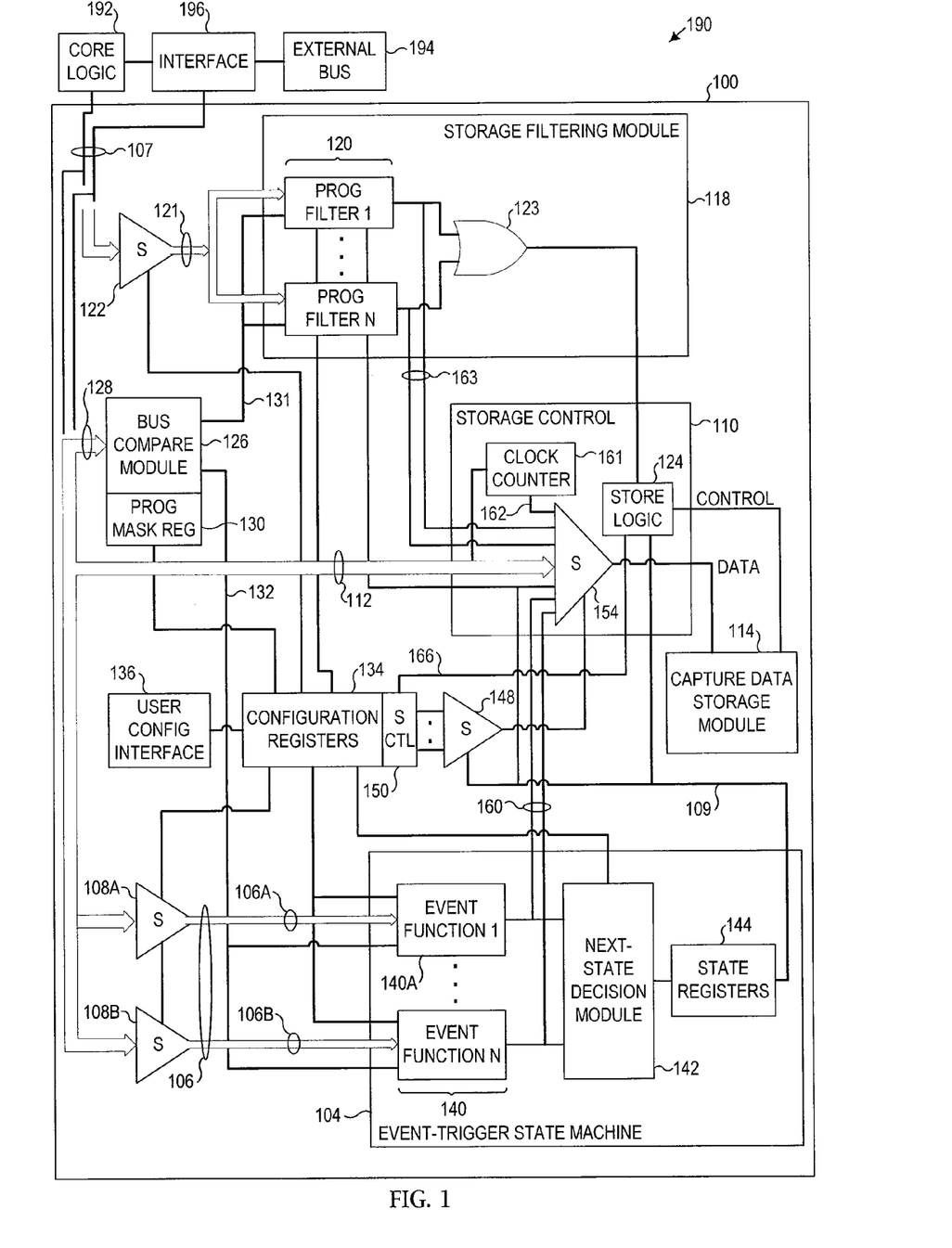
FIG. 1 is a block diagram of an apparatus and a system according to various embodiments of the current invention.

FIG. 1 is a block diagram of an apparatus 100 and a system 190 according to various embodiments of the current invention. The apparatus 100 may comprise a programmable on-chip logic analyzer (POCLA) suitable for inclusion on a mixed signal, digital application-specific integrated circuit (ASIC), or other digital device under test (DUT). The POCLA may be used to debug the DUT and/or electrical buses and interfaces coupled to the DUT.

In a further embodiment, a system 190 may include one or more of the apparatus 100. The system 190 may include core logic 192. The system 190 may also include an external bus 194 coupled to the core logic 192 via an interface 196. The system 190 may further include a set of input signal paths 107 to conduct a set of signals originating from the core logic 192 and/or from the external bus 194.

The apparatus 100 includes a state machine whose transitions are controlled by a number of programmable function modules. The apparatus 100 may also include one or more programmable filter function modules. The apparatus 100 includes capture storage facilities comprising an internal or external random access memory (RAM) in some embodiments. The capture RAM stores data selected by a programmer (e.g., a test engineer configuring the apparatus 100 as a POCLA) and/or filtered by the programmable filter function modules. A POCLA as further described below may conserve limited on-die space by storing only data specifically targeted for analysis.

The apparatus 100 may include an event-trigger state machine 104. The event-trigger state machine 104 monitors one or more "event function" subset(s) 106 of a set of input signal paths 107 (e.g., the event function subsets of paths 106A and 106B). The event function subsets of input paths 106 may be selected by selectors 108A and 108B or similar devices. "Event function" as used herein is a programmable set of logical operations performed on a set of binary signals under test by an "event function building block" (EFBB) (e.g., the EFBB 140A). Structures and methods associated with the EFBB are described in detail further below.

A result of an event function is a binary state which is set to true if the set of binary signals under test meets a set of conditions imposed by the programmable set of logical operations. An "event function subset of signals" as used herein means a set of binary signals under test which may be acted upon by an event function.

The event-trigger state machine 104 may transition to a programmable state at the occurrence of a programmable set of events associated with an event function subset of signals on the subsets of input signal paths 106. A programmable set of events in this context may include a selectable number of repetitions of one or more programmable state transitions associated with the event function subset of signals. The event-trigger state machine 104 may present a binary pattern corresponding to its programmable state at an output (e.g., at the output 109).

The apparatus 100 may also include a storage control module 110 coupled to the event-trigger state machine 104. The storage control module 110 stores states associated with a "storage" subset of signals on a storage subset 112 of the set of input signal paths 107. States associated with the storage subset of signals may be stored at a time relative to a transition of the event-trigger state machine 104 to a programmable state, also referred to herein as a "trigger state." Thus, states associated with the storage subset of signals may be stored at the occurrence of the trigger state or at a programmable time before or after the occurrence of the trigger state. In some embodiments the storage operation may be made further contingent on other storage criteria having been met as further described below.

The apparatus 100 may further include a capture data storage module 114 coupled to the storage control module 110. The capture data storage module 114 receives data and control signals from the storage control module 110 and stores the states associated with the storage subset of signals.

The apparatus 100 may also include a storage filtering module 118 coupled to the storage control module 110. The storage filtering module 118 may apply one or more programmable filters 120 to a "storage filter" subset of signals on a storage filter subset 121 of the set of input signal paths 107. The storage filter subset of input signal paths 121 may be selected by a selector 122 or similar device.

An output signal from each of the programmable filters 120 indicates whether the storage filter subset of signals meets the filtering criteria of the respective filter. Outputs of multiple programmable filters 120 may be logically OR'd (e.g., at a logical OR device 123) or otherwise combined to trigger store logic 124 (associated with the storage control module 110) to store the storage subset of signals.

The apparatus 100 may further include a bus compare module 126 coupled to the event-trigger state machine 104. A programmable mask register 130 may be coupled to the bus compare module 126. The bus compare module 126 compares states associated with a "bus compare" subset of signals on a bus compare subset 128 of the set of input signal paths 107 to contents of the programmable mask register 130. In some embodiments, each bit of the programmable mask register 130 corresponds to a state of a signal on a single path of the bus compare subset of input signal paths. The bus compare module 126 may produce a match trigger signal (e.g., a signal on a path 131 and/or 132) in the case of a match between the states associated with the bus compare subset of signals and the contents of the programmable mask register 130.

The apparatus 100 may also include a set of programmable configuration registers 134 coupled to the event-trigger state machine 104. The programmable configuration registers 134 store configuration parameters associated with a POCLA, including parameters associated with one or more state-transition event functions. The configuration parameters may be loaded into the event-trigger state machine 104 and into the programmable filters 120 associated with the storage filtering module 118, as applicable. A configuration interface 136 may be coupled to the set of programmable configuration registers 134 to accept input from a source external to the apparatus 100 and to load the configuration parameters accordingly.

The apparatus 100 may also include one or more state-transition event function modules 140 associated with the event-trigger state machine 104. The state-transition event function modules 140 may be coupled to the set of programmable configuration registers 134 and may accept configuration parameters from the configuration registers 134. The state-transition event function modules 140 may perform event functions on signals traversing the event function subsets 106 of the set of input signal paths 107 as specified by the configuration parameters. Such event functions may include a logical AND function, a logical NAND function, a logical OR function, a logical NOR function, a logical exclusive OR function, a negated logical exclusive OR function, a logical ONE, and/or a logical ZERO. Structures associated with the state-transition event function modules 140 are further detailed below.

A programmer or test engineer may program a state-transition event function module 140 to recognize a pattern of signals on the corresponding subset of input signal paths 106. (E.g., the event-function block 140A may be programmed to recognize a particular pattern of signals on the subset of input signal paths 106A). The event-trigger state machine 104 may transition from its current state to a determined new state if the event function subset of signals meets the programmed criteria.

More specifically, the apparatus 100 may further include a next-state decision module 142 coupled to the state-transition event function modules 140. The next-state decision module 142 contains combinatorial and/or event counter logic to cause a state transition of the event-trigger state machine 104 based upon a result of a function performed by the state-transition event function modules 140. Some embodiments may include the ability to program multiple ones of the event function blocks 140. Each such programmed event function block may recognize events on an associated one of the subsets of input signal paths 106. The next-state decision module 142 may include priority logic to arbitrate the outputs of programmed event function blocks in the case of simultaneous events on more than one of the subsets of input signal paths 106. The priority logic may determine which event function block output controls the next-state transition of the event-trigger state machine 104 if more than one output of the event-function blocks 140 is activated simultaneously. In some embodiments the next state decision module 142 may otherwise logically combine outputs of the event-function blocks 140 to determine a next state to which the event-trigger state machine should transition.

A plurality of state registers 144 may be communicatively coupled to the storage control module 110 to store one or more programmable states (e.g., a current state and/or past states) of the event-trigger state machine 104. One or more states may be designated as trigger states. The event-trigger state machine may cause a storage operation to be performed at a time relative to the time of entering a trigger state.

Figure 2:
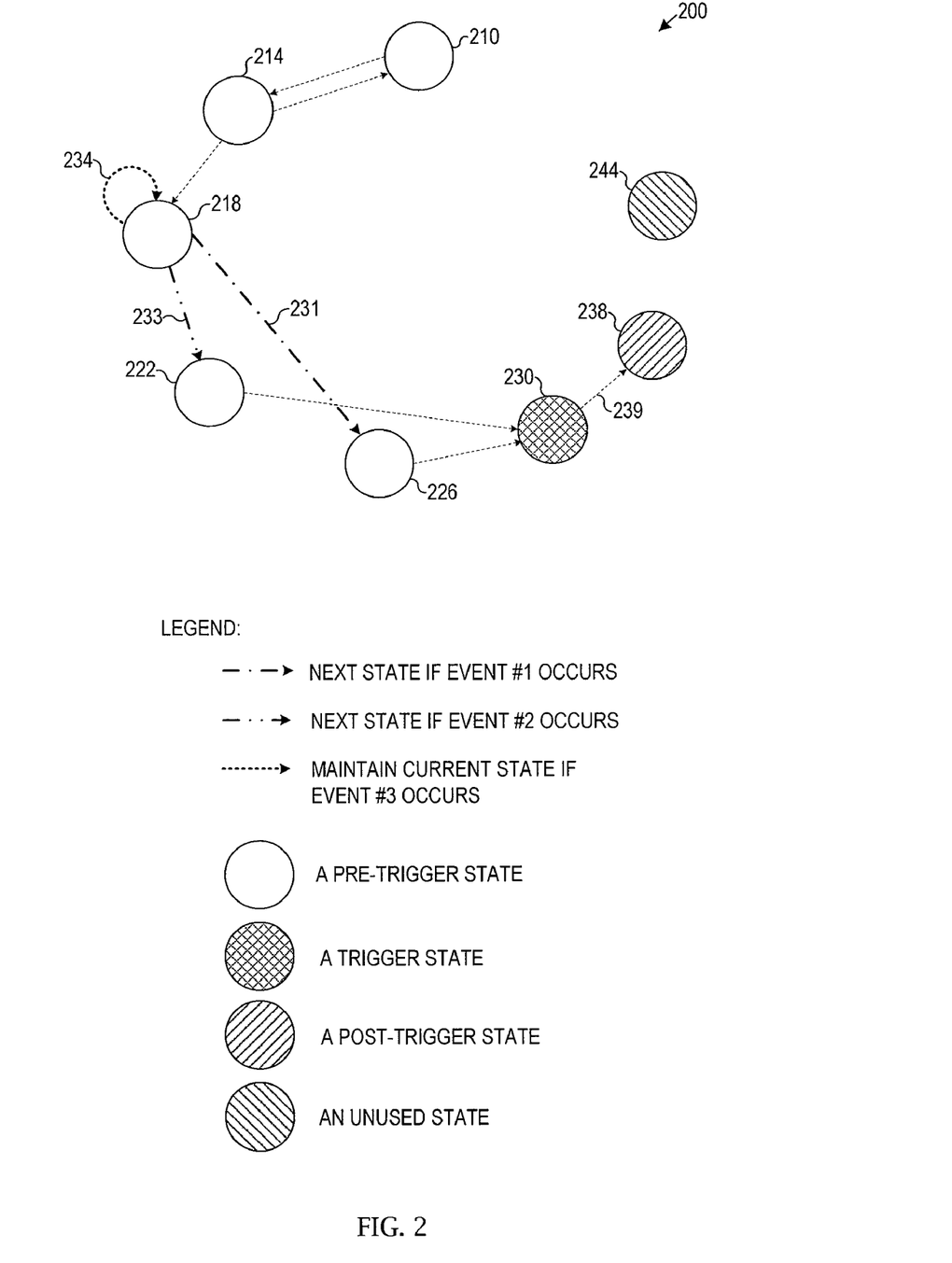
FIG. 2 is a state diagram depicting a set of example states and state transition paths associated with an event-trigger state machine according to various embodiments.

FIG. 2 is a state diagram 200 depicting a set of example states and state transition paths associated with the event-trigger state machine 104 according to various embodiments. The state machine 104 may transition back and forth between a set of pre-trigger states (e.g., the pre-trigger states 210, 214, 218, 222, and 226) before transitioning to a trigger state (e.g., the trigger state 230 in the example of FIG. 2). The trigger state, a pre-trigger state, or a post-trigger state may trigger one or more data capture operations. Data may be captured at a time relative to a transition to any state.

Events associated with signals on the event function subsets 106 of the set of input signal paths 107 may determine the path traversed by the event-trigger state machine when moving from a previous state to the next state. Assume, for example, that the state machine 104 is in the state 218. From the state 218 the state machine 104 may transition to the state 226 (e.g., via a path 231) if a first event occurs. In contrast, the state machine 104 may transition to the state 222 (e.g., via a path 233) if a second event occurs. Some events may cause the state machine to remain in its current state (e.g., via the state-change path 234). Further events occurring after the transition to the trigger state 230 may cause the state machine 104 to transition to a post-trigger state (e.g., to the state 238 via the state-change path 239). One or more unused states (e.g., the unused state 244) may also be associated with the event-trigger state machine 104.

In some embodiments herein the core logic of the DUT may operate at a lower clocking frequency than the electrical buses that interface to the DUT. Some embodiments may be capable of capturing and analyzing events which take place on the higher-speed interface buses as well as events associated with the core logic signals. That is, the event-trigger state machine 104 may effect multiple independent state transitions per core logic clock cycle. To accomplish this, some embodiments may perform parallel event-function operations on the input signals and may integrate the event-function results into an overall transition vector that drives the state machine.

Figure 2A:
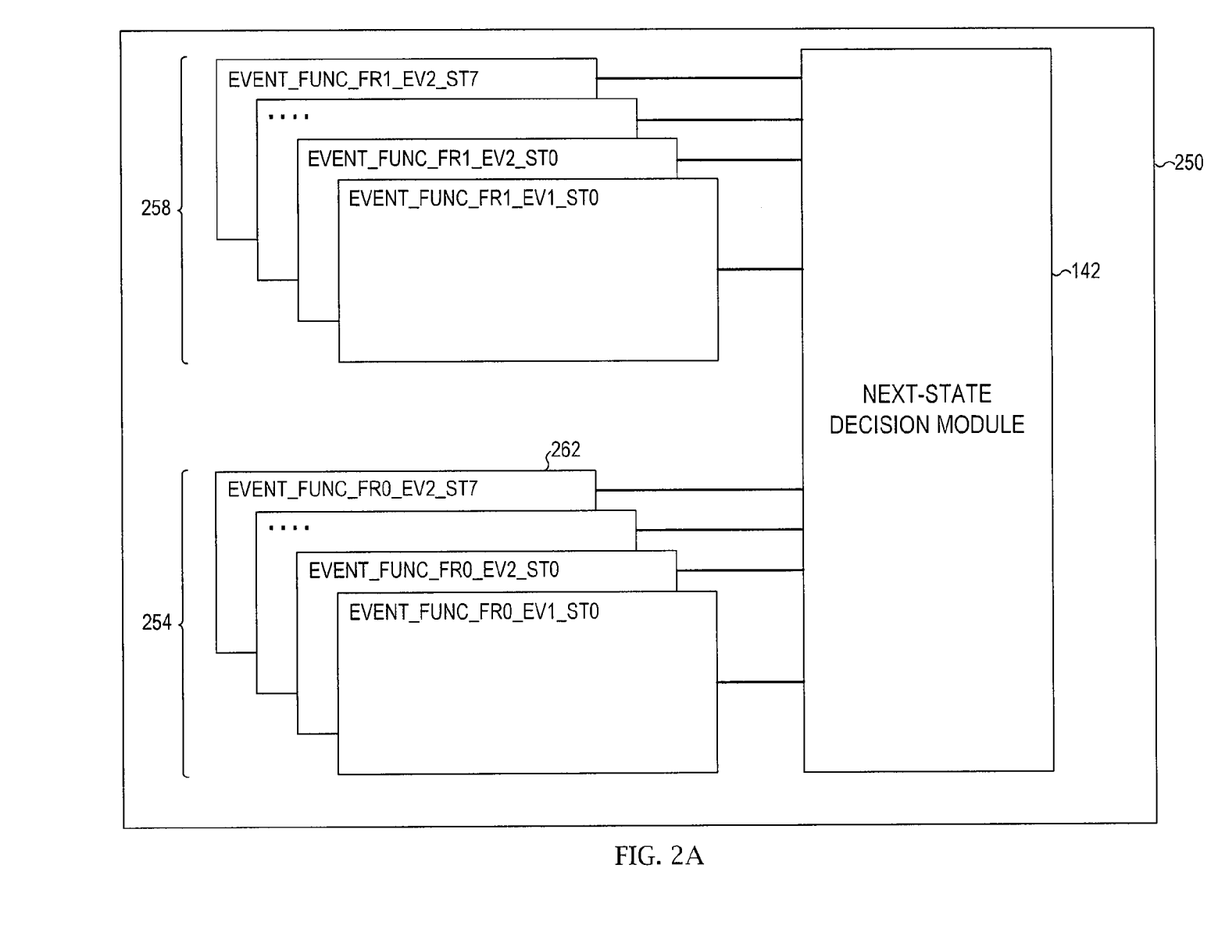
FIG. 2A is a block diagram of a parallel event-trigger state machine according to various embodiments.

FIG. 2A is a block diagram of a multi-parallel event-trigger state machine (MP-ETSM) 250 according to various embodiments. The MP-ETSM 250 may include parallel sets of EFBBs (e.g., the sets of EFBBs 254 and 258), one set for each bus clock frequency. In an example embodiment, a maximum of N exit branches may be possible from any current state to N possible next states (e.g., the exit branches 231 and 233 of FIG. 2 to the next states 226 and 222, respectively). In such an embodiment the behavior of the MP-ETSM 250 may be represented by the following state logic sequence:

IF (event #1) then GOTO (next state a)
ELSEIF (event #2) then GOTO (next state b)
. . .
ELSEIF (event #N) then GOTO (next state z)
ELSE hold current state If the highest bus clock frequency available for triggering, capture, and analysis operates at M times the frequency of the core, M represents a total number of timing frames from which to capture events. The total number of EFBBs that may be used for a stable implementation of the MP-ETSM 250 is then:

EFBBs in MP-ETSM 250=M*X*N

For example, if the number of possible events=2, the number of timing frames=2, and the total number of states in the state machine=8, the number of EFBBs is: 2*2*8=32.

As with the single-frame event-trigger state machine, each EFBB associated with MP-ETSM 250 (e.g., the EFBB 262) may be programmed separately to represent a transition from a given state. Each set of N*X EFBBs (e.g., the set of EFBBs 254) operates on event data associated with one high frequency bus clock cycle frame and analyzes possible resultant state transitions. The EFBBs 254 operate on events associated with a chronologically first bus frequency. The EFBBs 258 operate on events associated with a chronologically second bus frequency without respect to what happened or any events witnessed during the chronologically first bus clock cycle. This pattern may continue for subsequent, higher-frequency clock cycles until the core clock cycle has expired.

The resulting outputs of the EFBBs 254 and 258 are then passed through combinatorial logic in the next-state decision module 142. The next-state decision module 142 may create a transition vector of a width equal to the number of possible next states. In some embodiments, each bit of the transition vector may represent a possible next state associated with the core clock frame. A bit associated with the actual next frame may be set to a "logic true" state; the other bits may be set to "logic false." Other embodiments may encode the transition vector differently. In some embodiments the next-state decision module 142 may include event counters and/or threshold event counts. These devices may operate alone or in combination with the combinatorial logic to effect a state transition when a threshold number of events have been detected. The transition vector drives the MP-ETSM 250 to the correct next state prior to the next core clock cycle.

Turning back to FIG. 1, the apparatus 100 may also include a storage control register selector 148 coupled to the storage control module 110. The storage control register selector 148 selects a storage control register output from a plurality of storage control registers 150. A signal selector 154 may be coupled to the storage control register selector 148 to select the storage subset of signals for storage.

The signal selector 154 may also select other events within the apparatus 100 for storage. For example, states within a POCLA such as a state of the event-trigger state machine 104, the results of one or more state-transition event functions (e.g., communicated via the paths 160), a result of a programmable filter applied to the storage filter subset of signals (e.g., communicated via a path 163) and/or a count of a number of clock cycles sensed after the occurrence of a start signal may be stored. The latter clock cycle count may be maintained by a clock counter 161 and may be presented to the signal selector 154 via a path 162.

Embodiments herein may also trigger the storage of states associated with the storage subset of signals, as previously described. Some embodiments may trigger storage of these states if an output of one or more of the selected programmable filters indicates that programmable conditions are satisfied by the storage filter subset of signals. Other factors that may be considered in the storage trigger decision may include the output of a state-transition event function (e.g., the output on the path 160 of FIG. 1), a state of a clock counter (e.g., the state of the output on the path 162 of FIG. 1), or a state of a configuration parameter (e.g., the state of the output 166 of FIG. 1).

Figure 3:
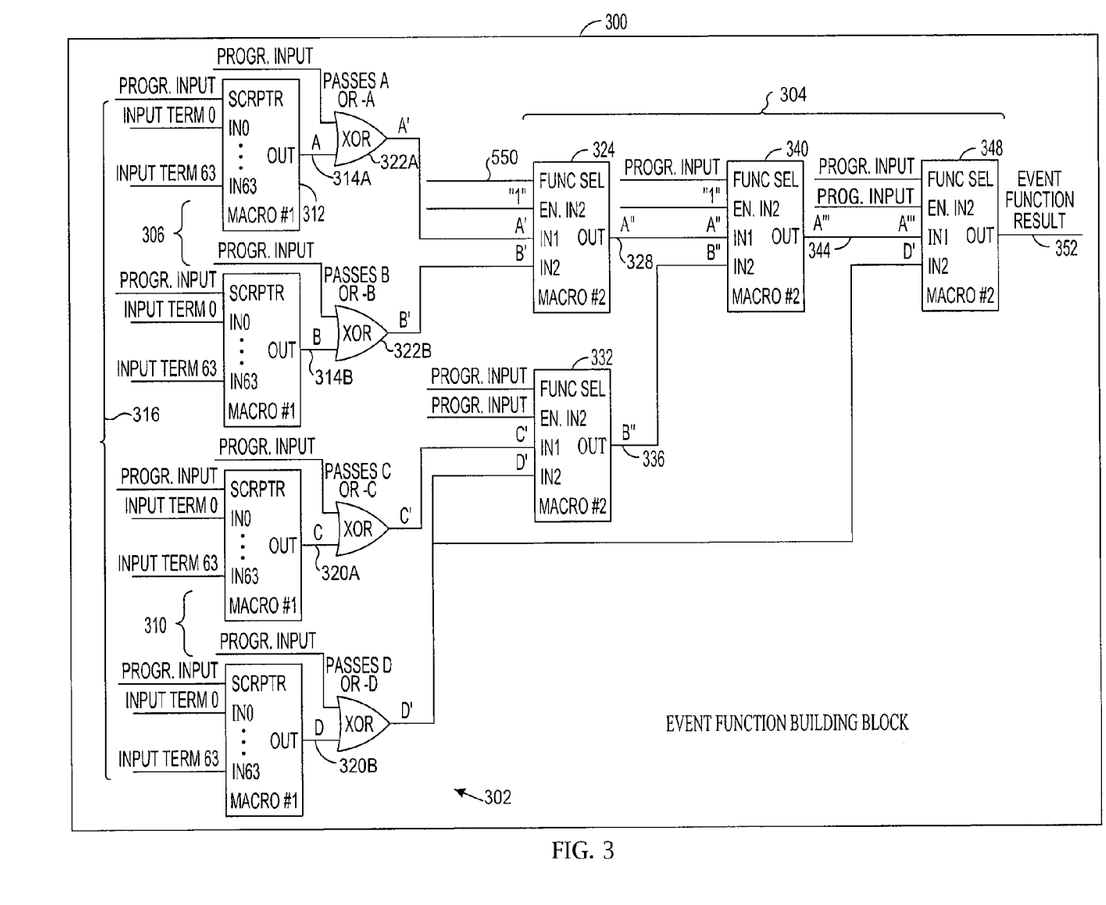
FIG. 3 is a block diagram of an example event function building block according to various embodiments.

FIG. 3 is a block diagram of an example event function building block (EFBB) 300 according to various embodiments. The programmable filters 120 and/or the state-transition event function modules 140 of FIG. 1 described above may be implemented with one or more sets of EFBBs.

The EFBB 300 may include an input signal selection macro module (ISSMM) stage 302. The ISSMM stage 302 may select a subset of signals from a DUT. The ISSMM stage 302 may also introduce one or more differential delays between individual signals in the subset of signals selected from the DUT. The EFBB 300 may also include a programmable logic macro module (PLMM) stage 304 coupled to the ISSMM stage 302. The PLMM stage 304 may perform a set of selectable logic functions on the subset of signals selected from the DUT as further described below. The EFBB 300 may also include an event function result output 352 coupled to the PLMM stage 304. The event function result output 352 may indicate that the subset of signals from the DUT, as acted upon by the ISSMM stage, has transitioned to a watched-for state. The watched-for state may be defined by configuration programmed into the PLMM stage 304.

More specifically, the EFBB 300 may include first and second pluralities of input signal selection macro modules (ISSMMs) 306 and 310, respectively. Each of the first plurality of ISSMMs (e.g., the ISSMM 312) selects a first initial input signal (e.g., the first initial input signal on the path 314A) from a set of input signals on a set of input signal paths (e.g., the set of input signal paths 316). A first plurality of initial input signals on the first set of initial input paths (e.g., on the first set of initial input paths 314A and 314B) is thus selected by the first plurality of ISSMMs 306. Likewise, each of the second plurality of ISSMMs 310 selects a second initial input signal (e.g., the input signal on the path 320A) from the set of input signals on the set of input signal paths 316. A second plurality of initial input signals on a second set of initial input paths (e.g., on the second set of initial input paths 320A and 320B) is thus selected by the second plurality of ISSMMs 310.

In some embodiments, a programmable inverter (e.g., the programmable inverters 322A and 322B shown as two-input exclusive-OR gates) may be associated with each of the initial input signals. The programmable inverters may be used to selectively invert the initial input signals.

The EFBB 300 may also include a first programmable logic macro module (PLMM) 324 coupled to the first plurality of ISSMMs 306. The first PLMM 324 may perform a first selectable logic function on one or more of the first initial input signals (e.g., the initial input signal on the path 314A) to yield a first intermediate result on a path 328.

The EFBB 300 may further include a second PLMM 332 coupled to the second plurality of ISSMMs 310. The second PLMM 332 may perform a second selectable logic function on one or more of the second initial input signals (e.g., on the second initial input signal on the path 320A) to yield a second intermediate result on the path 336.

The EFBB 300 may also include a third PLMM 340 coupled to the first and second PLMMs 324 and 332, respectively. The third PLMM 340 may perform a third selectable logic function on the first and/or second intermediate results (e.g., the results traversing the paths 328 and 336, respectively) to yield a third intermediate result on the path 344.

The EFBB 300 may further include a fourth PLMM 348 coupled to the third PLMM 340. The fourth PLMM 348 may perform a fourth selectable logic function on one or more of the third intermediate result on the path 344 and/or on one or more of the second initial input signals (e.g., the initial input signal on the path 320B) to yield an event function result on a path 352.

The PLMMs are organized in the EFBB 300 as described above as an example embodiment. Logical structures using PLMMs coupled in arrangements other than that of the EFBB 300 are contemplated by this disclosure. For example, bits widths other than four-wide may be implemented using appropriate numbers of ISSMMs and various combinations of PLMMs.

Figure 4:
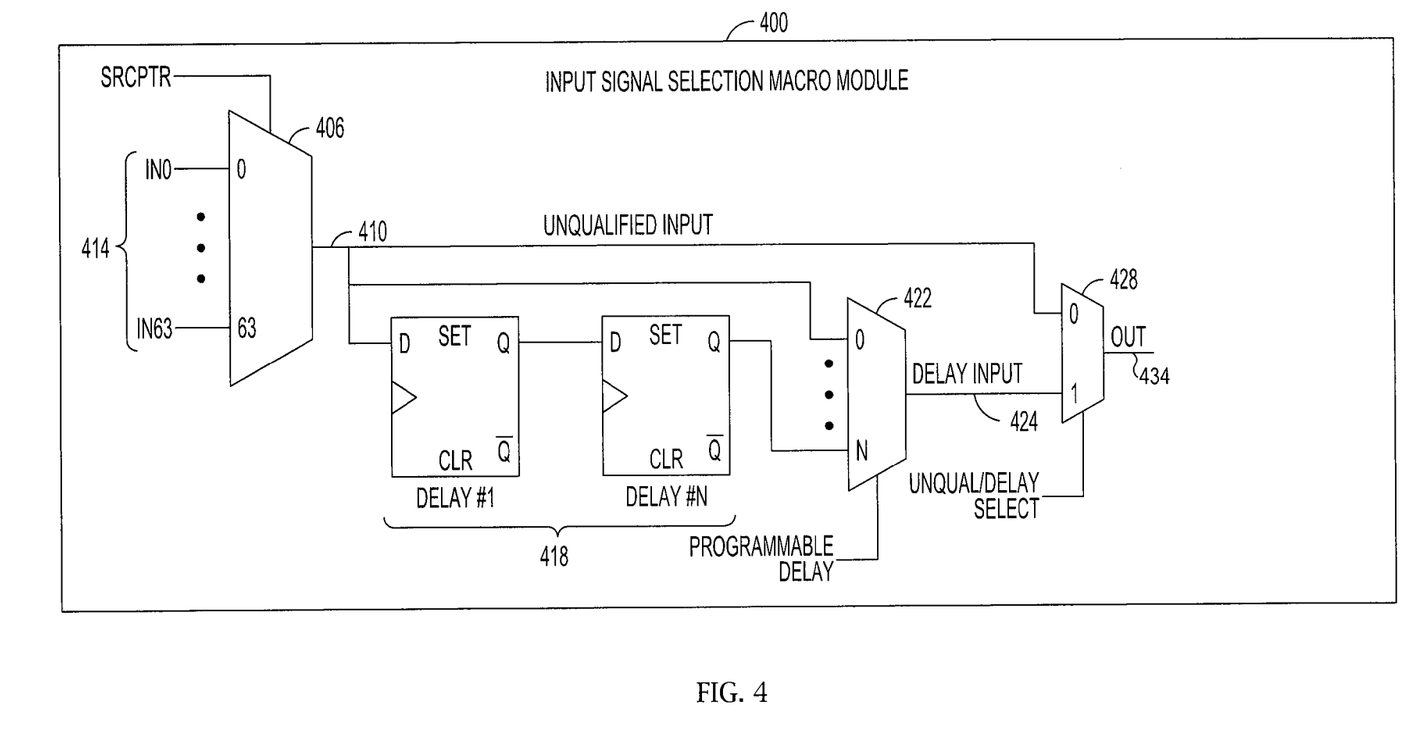
FIG. 4 is a block diagram of an example input signal selection macro module according to various embodiments.

FIG. 4 is a block diagram of an example input signal selection macro module (ISSMM) 400 according to various embodiments. The ISSMM 400 may be representative of input structures used in various embodiments (e.g., the ISSMMs 306 and 310 of FIG. 3). The ISSMM 400 may include a signal selector 406 to select an undelayed initial input signal on a path 410 from a set of input signals on a set of input signal paths 414. The ISSMM 400 may also include one or more signal delay paths, each path comprising one or more delay elements 418 to delay the initial input signal. The signal delay elements 418 may comprise programmable delay lines and/or a set of cascaded flip-flops among other possible signal delay elements.

A delayed signal selector 422 may select one of a number of delayed versions of the undelayed initial input signal to produce a delayed initial input on the path 424. An initial input signal selector 428 may select either the delayed initial input signal on the path 424 or the undelayed initial input signal on the path 410 as an initial input signal (e.g., the initial input signals on the paths 314A, 314B, 320A, and/or 320B of FIG. 3).

Figure 5:
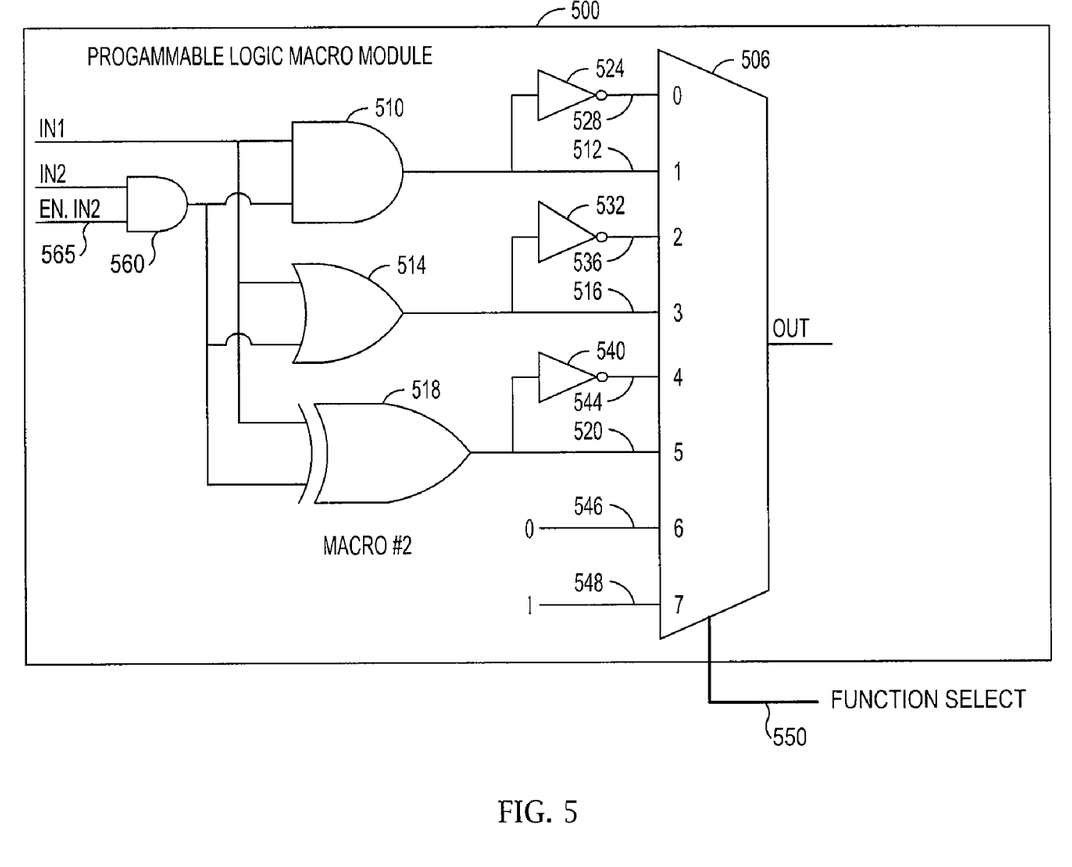
FIG. 5 is a block diagram of an example programmable logic macro module according to various embodiments.

FIG. 5 is a block diagram of an example programmable logic macro module (PLMM) 500 according to various embodiments. The PLMM 500 may be representative of programmable logic structures used in various embodiments (e.g., the PLMM 324 of FIG. 3). The PLMM 500 may include a logic function selector 506 to select among an available variety of logic functions.

The PLMM 500 may also include one or more first logic gates 510 coupled to a first input 512 of the logic function selector 506 to perform a logical AND function. One or more second logic gates 514 may be coupled to a second input 516 of the logic function selector 506 to perform a logical OR function. One or more third logic gates 518 may be coupled to a third input 520 of the logic function selector 506 to perform a logical exclusive OR function.

The PLMM 500 may also include a first logical inverter 524 coupled to the first logic gate 510 and to a fourth input 528 of the logic function selector 506. The first logical inverter 524 may, in conjunction with the first logic gate 510, provide a logical NAND input. A second logical inverter 532 may be coupled to the second logic gate 514 and to a fifth input 536 of the logic function selector 506. The second logical inverter 532 may, in conjunction with the second logic gate 514, provide a logical NOR input. A third logical inverter 540 may be coupled to the third logic gate 518 and to a sixth input 544 of the logic function selector 506 to provide a negated logical exclusive OR input. An input 546 of the logic function selector 506 may be tied to a logic ZERO level. An input 548 of the logic function selector 506 may be tied to a logic ONE level.

The PLMM 500 may also include a function select input 550 coupled to the logic function selector 506. The function select input 550 may be used to select one or more of the logical AND function, the logical NAND function, the logical OR function, the logical NOR function, the logical exclusive OR function, the negated logical exclusive OR function, a logical ONE, or a logical ZERO. The PLMM 500 may further include an input enable/disable gate 560 coupled to one or more of the logic gates 510, 514, and/or 518. The enable/disable gate 560 facilitates enabling and disabling one or more inputs to the PLMM 500 via a control input 565.

Any of the components previously described may be implemented in a number of ways, including embodiments in software. Software embodiments may be used in lieu of hardware components and/or in a simulation system. The output of such a simulation system may drive the various apparatus described herein.

Thus, the apparatus 100; the state machine 104; the paths 106, 106A, 106B, 107, 112, 121, 128, 131, 132, 231, 233, 234, 239, 160, 162, 163, 314A, 314B, 316, 320A, 320B, 328, 336, 344, 352, 410, 414, 424, 434; the selectors 108A, 108B, 122, 148, 154, 406, 422, 428, 506; the outputs 109, 166; the storage control module 110; the storage module 114; the storage filtering module 118; the programmable filters 120; the logical OR device 123; the store logic 124; the bus compare module 126; the registers 130, 134, 144, 150; the configuration interface 136; the event function modules 140, 140A; the next-state decision module 142; the state diagram 200; the states 210, 214, 218, 222, 226, 230, 238, 244; the clock counter 161; the system 190; the core logic 192; the external bus 194; the interface 196; the EFBB 300; the ISSMMs 306, 310, 312, 400; the inverters 322A, 322B, 524, 532, 540; the programmable logic macro modules 324, 332, 340, 348; the signal delay elements 418; the PLMM 500; the gates 510, 514, 518, 560; and the inputs 512, 516, 520, 528, 536, 544, 546, 548, 550, 565 may all be characterized as "modules" herein.

The modules may include hardware circuitry, optical components, single or multi-processor circuits, memory circuits, software program modules and objects, firmware, and combinations thereof, as desired by the architect of the apparatus 100 and the system 190 and as appropriate for particular implementations of various embodiments.

The apparatus and systems of various embodiments may be useful in applications other than a POCLA suitable for inclusion on mixed signal chips, digital ASICs, and other DUTs in a production environment. Thus, various embodiments of the invention are not to be so limited. The illustrations of the apparatus 100 and the system 190 are intended to provide a general understanding of the structure of various embodiments. They are not intended to serve as a complete description of all the elements and features of apparatus and systems that might make use of the structures described herein.

The novel apparatus and systems of various embodiments may comprise or be incorporated into electronic circuitry used in computers, communication and signal processing circuitry, single-processor or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods.

Figure 6A:
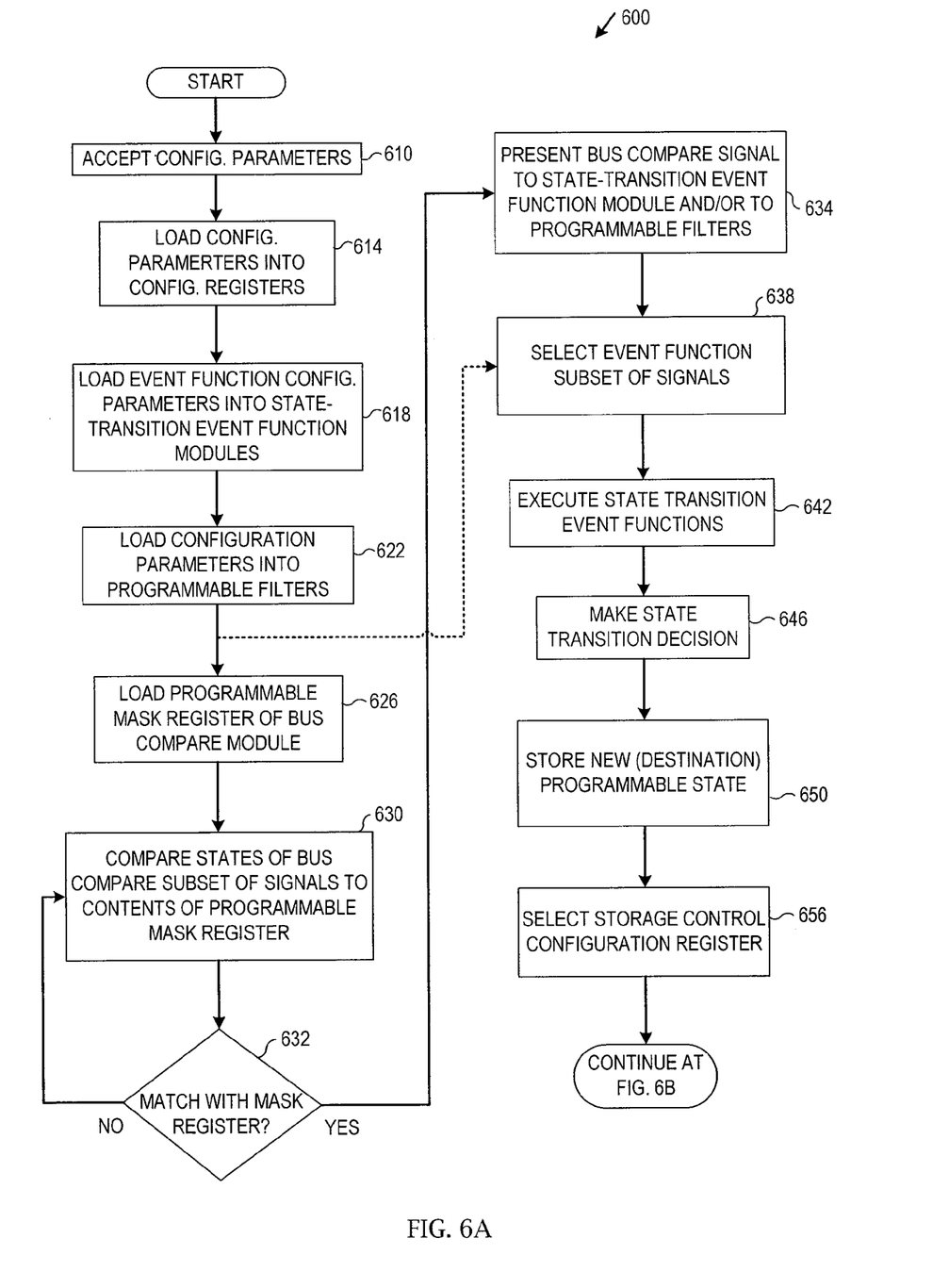
FIGS. 6A and 6B are flow diagrams illustrating a method according to various embodiments.
Figure 6B:
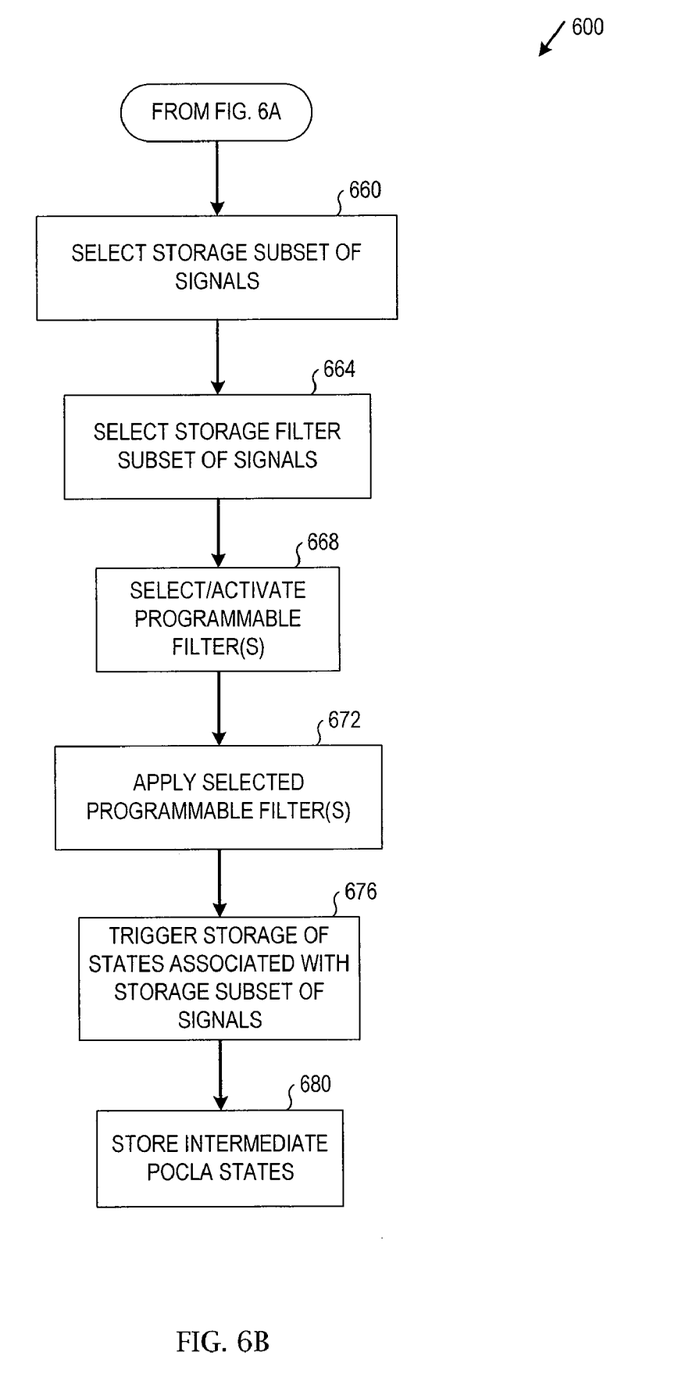

FIGS. 6A and 6B are flow diagrams illustrating a method 600 according to various embodiments. An event trigger state machine (e.g., the event trigger state machine 104 of FIG. 1) may be associated with a programmable on-chip logic analyzer (POCLA), as previously described. The event trigger state machine may transition to each of a set of programmable states as events associated with each state occur on one or more sets of input signal paths. A programmable number of occurrences of a programmable set of events associated with a set of signals on an "event function" subset of input signal paths (e.g., the event function subset of input signal paths 106 of FIG. 1) may cause a state transition of the event trigger state machine.

One or more of the programmable states may be denominated as storage trigger states. The storage trigger states initiate data capture and storage operations. A "storage subset" of signals on a storage subset of input signal paths (e.g., the storage subset of input signal paths 112 of FIG. 1) may be stored at a time relative to a transition of the event trigger state machine to a storage trigger state if a set of storage criteria have been met. The storage subset of signals may be different from the event function subset of signals in some embodiments.

A method 600 may commence at block 610 with accepting a plurality of configuration parameters associated with the POCLA at a configuration interface (e.g., the configuration interface 136 of FIG. 1). The configuration parameters may indicate which input signals to include in the event function and storage subsets of signals, the number of states to store, and Boolean conditions for triggering storage operations, among other parameters. The method 600 may continue at block 614 with loading the plurality of configuration parameters into a set of configuration registers (e.g., the configuration registers 134 of FIG. 1).

The method 600 may include loading one or more event function parameters into one or more state-transition event function modules (e.g., the event function modules 140 of FIG. 1) associated with the event trigger state machine, at block 618. The event function parameters are used to program the state-transition event function modules, to select event function subsets of signals, and to perform one or more logical functions on groups of these signals. Such functions may include a logical AND function, a logical NAND function, a logical OR function, a logical NOR function, a logical exclusive OR function, a negated logical exclusive OR function, a logical ONE, and/or a logical ZERO.

The method 600 may also include loading one or more filter configuration parameters into one or more programmable filters, at block 622 (e.g., the programmable filters 120 of FIG. 1). The programmable filters may be associated with a storage filtering module (e.g., the storage filtering module 118 of FIG. 1). The configuration parameters associated with each programmable filter may be used to program the filter to select a "storage filter" subset of signals and to perform one or more filtering operations on groups of these signals.

The method 600 may further include loading a programmable mask register (e.g., the programmable mask register 130 of FIG. 1) associated with a bus compare module (e.g., the bus compare module 126 of FIG. 1), at block 626. In some embodiments, each bit of the programmable mask register may correspond to a state of a single path of a "bus compare" subset of input signal paths (e.g., the bus compare subset of paths 128 of FIG. 1).

The method 600 may continue at block 630 with comparing states of a bus compare subset of signals on the bus compare subset of input signal paths to the contents of the programmable mask register. The method 600 may include determining whether the states of the bus compare subset of signals match the content of the programmable mask register, at block 632. If so, the method 600 may also include presenting a bus compare signal to one or more of a state-transition event function module or a programmable filter, at block 634.

The bus compare signal may be used by the state-transition event function module, the programmable filter, or other POCLA components. In some embodiments the bus compare signal may be used as an element of a data-store decision. It is noted that some embodiments may not perform the bus compare operations and may therefor proceed directly from block 622 to block 638.

The method 600 may continue at block 638 with selecting one or more event function subsets of signals (e.g., the subset of signals associated with the event function subset of paths 106 of FIG. 1). In some embodiments the selection may be based upon one or more configuration parameter settings. The method 600 may also include executing the state-transition event functions against the event function subsets of signals, at block 642. The method 600 may further include making a state-transition decision based upon the results of the state-transition event functions executed against the event function subsets of signals, at block 646. That is, one or more event functions executed against the function subset of signals may cause the event-trigger state machine to change states. The method 600 may also include storing the new, or destination programmable state associated with the event trigger state machine, at block 650.

The method 600 may continue at block 656 with selecting a storage control register from a plurality of storage control registers (e.g., the storage control registers 150 of FIG. 1). Some embodiments may choose a storage control register based upon the state of the event trigger state machine. The method 600 may also include selecting a particular subset of signals for storage, at block 660. Some embodiments may use the contents of the previously-chosen storage control register to select the storage subset of signals.

The method 600 may continue at block 664 with selecting the storage filter subset of signals (e.g., from the storage filter subset of input signal paths 121 of FIG. 1). This selection may be based upon a configuration parameter. The method 600 may also include selecting and/or activating one or more programmable filters from a plurality of programmable filters (e.g., the programmable filters 120 of FIG. 1), at block 668. In some embodiments the selection of programmable filters may be based upon a programmable state of the event-trigger state machine.

The method 600 may include applying the selected programmable filters to the storage filter subset of signals, at block 672. The method 600 may also include triggering a storage of states associated with the storage subset of signals, at block 676. Some embodiments may trigger storage of these states if an output of one or more of the selected programmable filters indicates that programmable conditions are satisfied by the storage filter subset of signals. That is, one or more outputs of the selected programmable filters may be logically OR'd to create a storage trigger. Other factors that may be considered in the storage trigger decision may include the output of a state-transition event function (e.g., the outputs 160 of FIG. 1), a state of a clock counter (e.g., the state of the output 162 of FIG. 1), or a state of a configuration parameter (e.g., the state of the output 166 of FIG. 1).

In some embodiments the method 600 may store other information in addition to the storage subset of signals, including intermediate-state information, at block 680. States within the POCLA that may be stored include a state of the event-trigger state machine, the results of one or more state-transition event functions, a result of a programmable filter applied to the storage subset of signals, and/or a count of a number of clock cycles sensed after the occurrence of a start signal.

Semiconductor elements may be integrated to form an event function building block (EFBB) module. The EFBB may be capable of performing the event function operations and/or the programmable filter operations described above. Multiple EFBBs may be assembled in an event-trigger state machine, a storage filtering module, or both. The resulting event-trigger state machine and/or storage filtering module may be included as components of a programmable on-chip logic analyzer, as previously described.

Figure 7A:
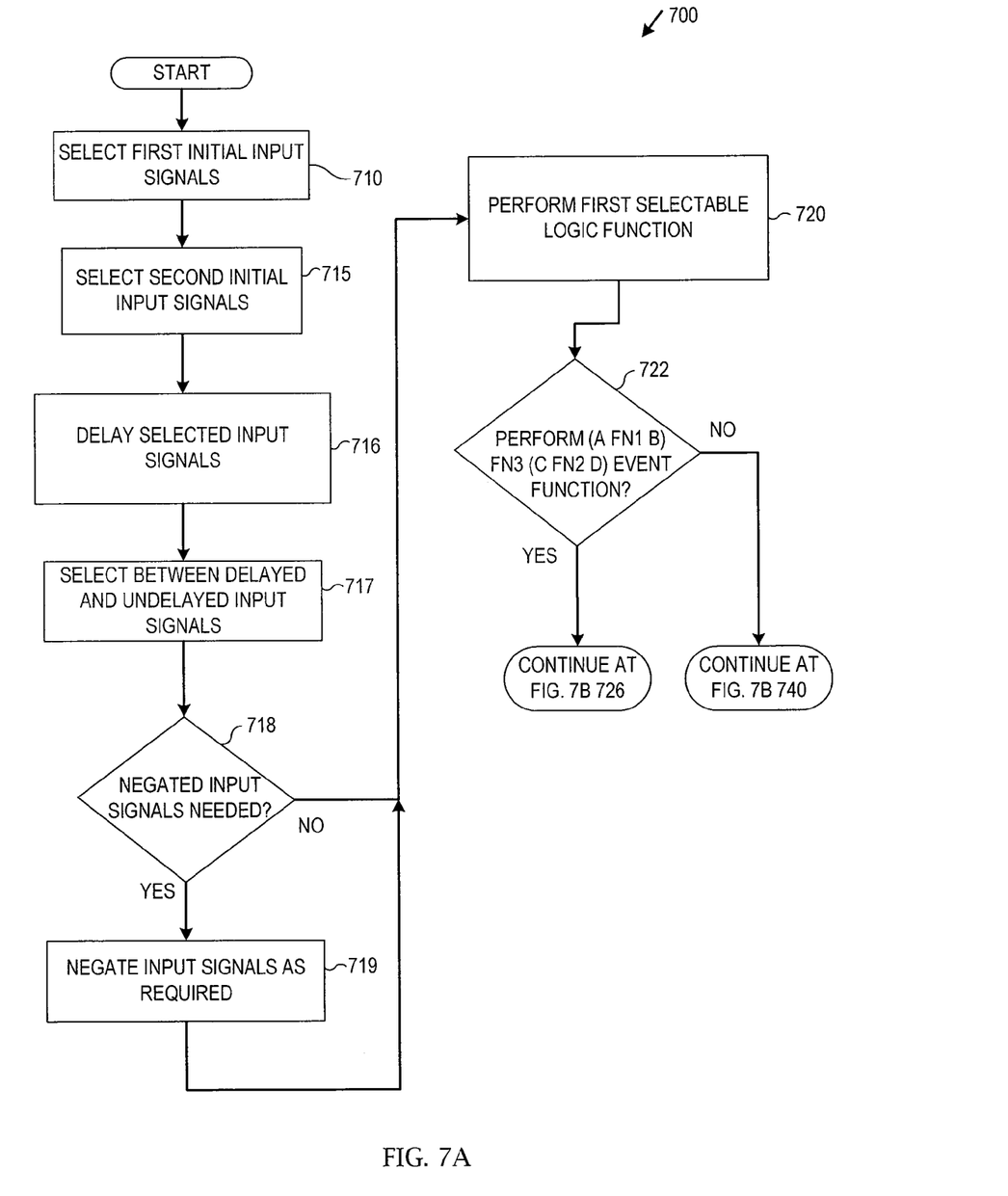
FIGS. 7A and 7B are flow diagrams illustrating a method according to various embodiments.
Figure 7B:
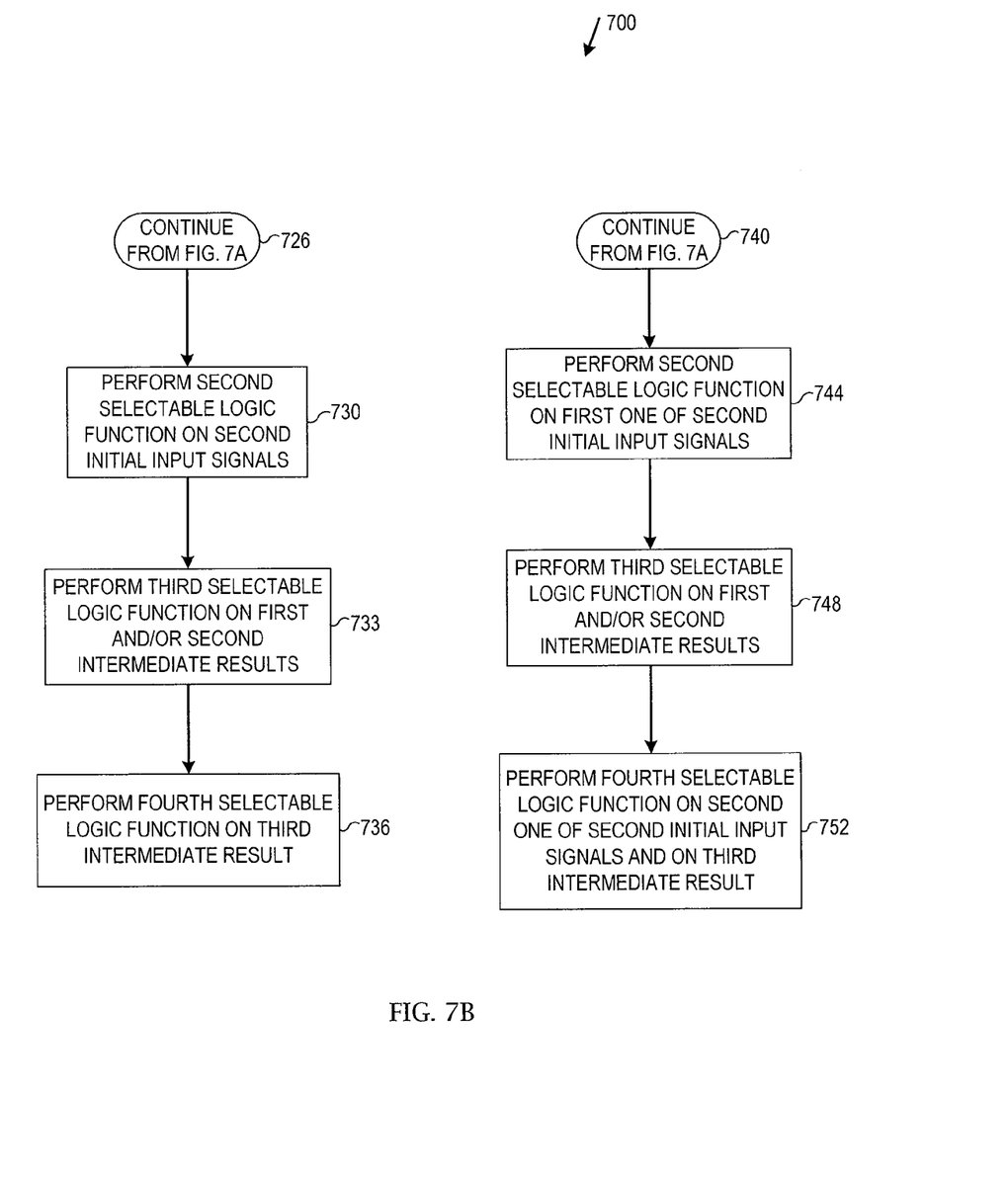

FIGS. 7A and 7B are flow diagrams illustrating a method 700 according to various embodiments. In some embodiments the method 700 may be performed by the above-described EFBB. The method 700 may commence at block 710 with selecting a first plurality of initial input signals (e.g., a first initial input signal traveling on the path 314A of FIG. 3) from a set of input signals (e.g., from the set of input signals on paths 316 of FIG. 3). The first plurality of initial input signals may be selected using a first plurality of input signal selection macro modules (ISSMMs) (e.g., the ISSMMs 306 of FIG. 3).

The method 700 may also include selecting a second plurality of initial input signals (e.g., a second initial input signal traveling on the path 320A of FIG. 3), at block 715. The second plurality of initial input signals may be selected from the set of input signals using a second plurality of input signal selection macro modules (e.g., the second plurality of input signal selection macro modules 310).

The method 700 may further include delaying one or more of the selected input signals by a programmable delay length (e.g., using programmable delay mechanisms such as the signal delay elements 418 of FIG. 4), at block 716. The method 700 may also include selecting a delayed or undelayed version of one or more input signals (e.g., using the delayed signal selector 422 of FIG. 4), at block 717.

The method 700 may further include deciding whether any of the initial input signals should be negated, at block 718. If so, the method 700 may also include negating one or more of the first or second plurality of initial input signals, at block 719.

The method 700 may continue at block 720 with performing a first selectable logic function on one or more of the first plurality of initial input signals to yield a first intermediate result (e.g., the first intermediate result traversing the path 328 of FIG. 3). A first programmable logic module (e.g., the first programmable logic module 324 of FIG. 3) may perform the first selectable logic function on the first plurality of initial input signals.

In an example embodiment, let A, B, C, and D be the states of binary signals operated on by PLMM components of an EFBB (e.g., signals on the paths A', B', C', and D' operated on by the logic functions AND, NAND, OR, NOR, exclusive OR, negated exclusive OR, logical ONE, and/or logical ZERO programmed into the PLMMs 324, 332, 340, and 348 of FIG. 3). The method 700 may include determining whether an event function of the form (A fn1 B) fn3 (C fn2 D) is desired, at block 722. If so, the method 700 may continue at FIG. 7B with performing a second selectable logic function on one or more of the second plurality of initial input signals, at block 730. The second selectable logic function may yield a second intermediate result (e.g., the second intermediate result traversing the path 336 of FIG. 3). A second programmable logic macro module (e.g., the programmable logic macro module 332 of FIG. 3) may perform the second selectable logic function.

The method 700 may further include performing a third selectable logic function on one or more of the first or second intermediate results to yield a third intermediate result (e.g., the third intermediate result traversing the path 344 of FIG. 3), at block 733. A third programmable logic macro module (e.g., the programmable logic macro module 340 of FIG. 3) may perform the third selectable logic function.

The method 700 may conclude with performing a fourth selectable logic function on the third intermediate result, at block 736. The fourth selectable logic function may yield an event function result (e.g., the event function result on the path 352 of FIG. 3). A fourth programmable logic macro module (e.g., the programmable logic macro module 348 of FIG. 3) may perform the fourth selectable logic function.

If an event function of the form (A fn1 B) fn3 (C fn2 D) is not desired (decision block 722), the method 700 may follow a path to produce an event function of the form ((A fn1 B) f3 C) f4 D. In the latter case the method 700 may continue at block 744 with performing a second selectable logic function on a first one of the second plurality of initial input signals. The second selectable logic function operation may yield a second intermediate result (e.g., the second intermediate result traversing the path 336 of FIG. 3). A second programmable logic macro module (e.g., the programmable logic macro module 332 of FIG. 3) may perform the second selectable logic function.

The method 700 may further include performing a third selectable logic function on one or more of the first or second intermediate results to yield a third intermediate result (e.g., the third intermediate result traversing the path 344 of FIG. 3), at block 748. A third programmable logic macro module (e.g., the programmable logic macro module 340 of FIG. 3) may perform the third selectable logic function.

The method 700 may conclude with performing a fourth selectable logic function to yield the event function result (e.g., the event function result on the path 352 of FIG. 3), at block 752. The fourth selectable logic function may be performed on a second one of the second plurality of initial input signals and on the third intermediate result. A fourth programmable logic macro module (e.g., the programmable logic macro module 348 of FIG. 3) may perform the fourth selectable logic function.

The two event function forms described above are example embodiments. The method 700 and other similar methods may include activities associated with other event function forms as may be implemented by the example EFBB or by other EFBB structures contemplated by this disclosure.

The selectable logic functions may be performed by the PLMMs described above (e.g., the PLMM 500 of FIG. 5). A function select line to each of the PLMMs may be exercised to select one or more of the selectable logic functions for each PLMM. Thus, the method 700 may include exercising the function select line (e.g., the function select line 550 of FIGS. 3 and 5) for one or more PLMMs (e.g., the PLMMs 324, 332, 340, and 348 of FIG. 3) in each EFBB (e.g., the EFBBs 120 and 140 of FIG. 1) used in a POCLA (e.g., the apparatus 100 of FIG. 1). Each selectable logic function may comprise one or more of a logical AND operation, a logical OR operation, a logical exclusive OR operation, a logical NAND operation, a logical NOR operation, a negated exclusive OR operation, a logical ONE operation, or a logical ZERO operation.

It is noted that the activities described herein may be executed in an order other than the order described. The various activities described with respect to the methods identified herein may also be executed in repetitive, serial, and/or parallel fashion.

A software program may be launched from a computer-readable medium in a computer-based system to execute functions defined in the software program. Various programming languages may be employed to create software programs designed to implement and perform the methods disclosed herein. The programs may be structured in an object-oriented format using an object-oriented language such as Java or C++. Alternatively, the programs may be structured in a procedure-oriented format using a procedural language, such as assembly or C. The software components may communicate using well-known mechanisms, including application program interfaces, inter-process communication techniques, and remote procedure calls, among others. The teachings of various embodiments are not limited to any particular programming language or environment.

The apparatus, systems, and methods described herein may operate to selectively capture and store the states of signals associated with a DUT. The apparatus and systems may be integrated onto a semiconductor die together with a mixed-signal or digital DUT such as an application-specific integrated circuit (ASIC). The resulting POCLA may permit the capture of internal signals that are not conducted outside the die. Decreased design and testing costs may result.

The apparatus and systems herein may include a state machine whose states are controlled by one or more programmable function modules. Some embodiments may also include one or more programmable filters. The programmable function modules and filters may be implemented with multiple instantiations of a single "event function" component described herein. The state machine and programmable filters operate to determine what data is captured and the logical conditions for data capture. These functions enable test personnel to search for a series of events and to store relevant data before, after, or during selected phases of the series of events.

By way of illustration and not of limitation, the accompanying figures show specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This Detailed Description, therefore, is not to be taken in a limiting sense. The breadth of various embodiments is defined by the appended claims and the full range of equivalents to which such claims are entitled.

Such embodiments of the inventive subject matter may be referred to herein individually or collectively by the term "invention" merely for convenience and without intending to voluntarily limit this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. An apparatus, comprising:
an event-trigger state machine to monitor an event function subset of input signal paths, to transition to a programmable state at the occurrence of a programmable set of events associated with an event function subset of signals on the event function subset of input signal paths, and to generate a binary pattern associated with the programmable state;
a storage control module coupled to the event-trigger state machine to store states associated with a storage subset of signals on a storage subset of input signal paths at a time relative to a transition to the programmable state upon a determination that a set of storage criteria has been met; and
a storage filtering module coupled to the storage control module to apply at least one programmable filter to a storage filter subset of signals on a storage filter subset of input signal paths and to trigger the storage control module to store the storage subset of signals if an output of the programmable filter indicates that programmable conditions associated with the storage filter subset of signals are satisfied.

2. An apparatus, comprising:
an event-trigger state machine to monitor an event function subset of input signal paths, to transition to a programmable state at the occurrence of a programmable set of events associated with an event function subset of signals on the event function subset of input signal paths, and to generate a binary pattern associated with the programmable state;
a storage control module coupled to the event-trigger state machine to store states associated with a storage subset of signals on a storage subset of input signal paths at a time relative to a transition to the programmable state upon a determination that a set of storage criteria has been met; and
a bus compare module coupled to the event-trigger state machine to compare states associated with a bus compare subset of signals on a bus compare subset of input signal paths to contents of a programmable mask register coupled to the bus compare module and to produce a match trigger signal in the case of a match between the states associated with the bus compare subset of signals and the contents of the programmable mask register, wherein each bit of the programmable mask register corresponds to a state of a signal on a single one of the bus compare subset of input signal paths.

3. An apparatus, comprising:
an event-trigger state machine to monitor an event function subset of input signal paths, to transition to a programmable state at the occurrence of a programmable set of events associated with an event function subset of signals on the event function subset of input signal paths, and to generate a binary pattern associated with the programmable state;
a storage control module coupled to the event-trigger state machine to store states associated with a storage subset of signals on a storage subset of input signal paths at a time relative to a transition to the programmable state upon a determination that a set of storage criteria has been met;
a set of programmable configuration registers coupled to the event-trigger state machine to store configuration parameters associated with at least one state-transition event function and to load the at least one configuration parameter into the event-trigger state machine; and a configuration interface coupled to the set of programmable configuration registers to accept the configuration parameters from a source external to the apparatus.

4. The apparatus of claim 3, further comprising:

at least one state-transition event function module coupled to the set of programmable configuration registers to accept the at least one configuration parameter and to perform the event function specified by the at least one configuration parameter.

5. The apparatus of claim 3, further comprising:

a plurality of sets of state-transition event function modules coupled to the set of programmable configuration registers to accept the at least one configuration parameter and to perform the event function specified by the at least one configuration parameter, each set of state-transition event function modules to analyze a set of events associated with a distinct timing frame.

6. The apparatus of claim 4, further comprising:

a next-state decision module coupled to the at least one state-transition event function module to cause a transition of the programmable state of the event-trigger state machine based upon a result of a function performed by the at least one state-transition event function module.

7. The apparatus of claim 1, further comprising:

a plurality of state registers communicatively coupled to the storage control module to store the programmable state of the event-trigger state machine.

8. The apparatus of claim 1, further comprising:

a storage control register selector coupled to the storage control module to select a storage control register from a plurality of storage control registers.

9. The apparatus of claim 8, further comprising:

a signal selector coupled to the storage control register selector to select the storage subset of signals for storage.

10. The apparatus of claim 2, wherein the programmable set of events comprises a selectable number of repetitions of at least one programmable state transition associated with the event function subset of signals.

11. The apparatus of claim 2, further comprising:

a storage module coupled to the storage control module to receive data and control signals from the storage control module and to store the states associated with the storage subset of signals.

12. A system, comprising:

core logic;

an external bus coupled to the core logic via an interface;

a set of input signal paths coupled to the core logic to conduct a set of signals, the set of signals originating from at least one of the core logic or the external bus;

an event-trigger state machine to monitor an event function subset of input signal paths, to transition to a programmable state at the occurrence of a programmable set of events associated with an event function subset of signals on the event function subset of input signal paths, and to generate a binary pattern associated with the programmable state; and a storage control module coupled to the event-trigger state machine to store states associated with a storage subset of signals on a storage subset of input signal paths at a time relative to a transition to the programmable state upon a determination that a set of storage criteria have been met; and a storage filtering module coupled to the storage control module to apply at least one programmable filter to a storage filter subset of signals on a storage filter subset of input signal paths and to trigger the storage control module to store the storage subset of signals if an output of the programmable filter indicates that programmable conditions associated with the storage filter subset of signals are satisfied.

13. The system of claim 12, further comprising:

a storage module coupled to the storage control module to receive data and control signals from the storage control module and to store the states associated with the storage subset of signals.

14. A method, comprising:

at an event trigger state machine associated with an on-chip logic analyzer, transitioning to a programmable state at a programmable number of occurrences of a programmable set of events associated with an event function subset of signals on an event function subset of input signal paths;

storing states associated with a storage subset of signals on a storage subset of input signal paths at a time relative to a transition to the programmable state upon a determination that a set of storage criteria has been met;

loading at least one configuration parameter into a programmable filter associated with a storage filtering module to program the programmable filter;

applying the programmable filter to a storage filter subset of signals on a storage filter subset of input signal paths; and triggering a storage of the states associated with the storage subset of signals upon a determination that an output of the programmable filter indicates that programmable conditions are satisfied by the storage filter subset of signals.

15. The method of claim 14, further comprising:

selecting the storage filter subset of signals based upon a configuration parameter.

16. The method of claim 14, further comprising:

selecting the programmable filter from a plurality of programmable filters based upon the programmable state of the event-trigger state machine.

17. The method of claim 14, further comprising:

accepting a plurality of configuration parameters associated with the on-chip logic analyzer at a configuration interface; and loading the plurality of configuration parameters into a set of configuration registers.

18. The method of claim 17, wherein one configuration parameter of the plurality of configuration parameters represents a number of states to store.

19. A method, comprising:

at an event trigger state machine associated with an on-chip logic analyzer, transitioning to a programmable state at a programmable number of occurrences of a programmable set of events associated with an event function subset of signals on an event function subset of input signal paths;

storing states associated with a storage subset of signals on a storage subset of input signal paths at a time relative to a transition to the programmable state upon a determination that a set of storage criteria has been met;

loading a programmable mask register associated with a bus compare module, wherein each bit of the programmable mask register corresponds to a single path of a bus compare subset of input signal paths;

comparing states of a bus compare subset of signals on the bus compare subset of input signal paths to the contents of the programmable mask register; and presenting a bus compare signal to at least one of a state-transition event function module or a programmable filter upon a determination that the bus compare subset of signals matches the contents of the programmable mask register, the bus compare signal operating as an element of a data-store decision.

20. A method, comprising:

at an event trigger state machine associated with an on-chip logic analyzer, transitioning to a programmable state at a programmable number of occurrences of a programmable set of events associated with an event function subset of signals on an event function subset of input signal paths;

storing states associated with a storage subset of signals on a storage subset of input signal paths at a time relative to a transition to the programmable state upon a determination that a set of storage criteria has been met;

loading at least one event function parameter into a state-transition event function module associated with the event trigger state machine to program the state-transition event function module;

executing a state-transition event function specified by the at least one event function parameter using the event function subset of signals as inputs to the event function module;

at the event trigger state machine, making a state-transition decision based upon a result of the state-transition event function; and storing the programmable state associated with the event trigger state machine.

21. The method of claim 20, further comprising:
selecting the event function subset of signals based upon a configuration parameter.

22. A method, comprising:

at an event trigger state machine associated with an on-chip logic analyzer, transitioning to a programmable state at a programmable number of occurrences of a programmable set of events associated with an event function subset of signals on an event function subset of input signal paths;

storing states associated with a storage subset of signals on a storage subset of input signal paths at a time relative to a transition to the programmable state upon a determination that a set of storage criteria has been met;

triggering a storage of the states associated with the storage subset of signals based upon at least one of an output of a storage filtering module, an output of at least one state-transition event function, a state of a clock counter, or a state of a configuration parameter.

23. The method of claim 22, further comprising:
storing at least one of (a) the programmable state of the event trigger state machine, (b) a result of a state-transition event function, or (c) a count of a number of clock cycles sensed after sensing a start signal.

24. The method of claim 22, further comprising:
selecting storage control register contents from a plurality of storage control registers based upon the programmable state of the event trigger state machine.

25. The method of claim 24, further comprising:
selecting the storage subset of signals for storage using the selected storage control register contents.

\* \* \* \* \*